United States Patent [19]

Hara et al.

[11] 4,369,371
[45] Jan. 18, 1983

[54] BROADBAND HIGH SPEED OPTOELECTRONIC SEMICONDUCTOR SWITCH

[75] Inventors: Elmer H. Hara, Kanata; R. Ian MacDonald; Robert S. H. Hum, both of Ottawa; Brian S. Kawasaki, Carleton Place, all of Canada

[73] Assignee: Canadian Patents & Dev. Limited, Ottawa, Canada

[21] Appl. No.: 209,956

[22] Filed: Nov. 24, 1980

[51] Int. Cl.³ .............................................. G02B 27/00
[52] U.S. Cl. ................................. 250/551; 250/214 R; 307/311
[58] Field of Search ........................... 250/551, 214 R; 307/311; 455/602, 619

[56] References Cited

U.S. PATENT DOCUMENTS 4,242,595  12/1980  Lehovec ........................ 307/311 X
4,286,171   8/1981  Hara et al. ........................ 250/551

*Primary Examiner*—David C. Nelms
*Assistant Examiner*—Darwin R. Hostetter
*Attorney, Agent, or Firm*—Edward Rymek

[57] ABSTRACT

The optoelectronic switch includes a photosensitive GaAs FET onto which an optical signal may be directed. The optical signal is derived from an RF modulated light source. A voltage circuit is connected to the FET to switch the FET "on" or "off" by placing a positive or zero voltage respectively on the drain. An isolation of over 70 dB is obtained in this FET switch.

5 Claims, 6 Drawing Figures

BROADBAND HIGH SPEED OPTOELECTRONIC SEMICONDUCTOR SWITCH

BACKGROUND OF THE INVENTION

This invention is directed to an RF switch and in particular to an optoelectronic semiconductor switch.

The need for a switch which has a transmission bandwidth in excess of 100 MHz and an isolation of better than 70 dB is necessary for the successful implementation of a broadband communications service to subscribers. Fast-acting, reliable broadband switches are also required for communications satellites.

Coaxial switches can have an isolation of 60 dB or better over a frequency range of DC to 18 GHz, however their size is large compared to semiconductor switches and therefore these switches would not be practical in switching arrays. The RF PIN diode switch of the type described in the Hewlett Packard Application Note 929 is very fast and has an isolation in the order of 50 dB. However, the current required to maintain the "off" state of an PIN diode switch is of the order of 10 mA which is high for crosspoint switching matrices where most of the crosspoint switches are normally in the "off" state.

Another switch, the "Optoelectronic Cross-Point Switch" described in U.S. Patent application Ser. No. 017,722 filed on Mar. 5, 1979, by Elmer H. Hara and R. Ian MacDonald has a broad bandwidth and a high isolation factor, however, a significant amount of power is consumed maintaining the switch in the "off" state.

SUMMARY OF THE INVENTION

It is therefore an object of this invention to provide an rf semiconductor switch having a broad transmission bandwidth, a high isolation factor and a low electrical power consumption when maintained in the "off" state.

This and other objects are achieved in an optoelectronic switch which includes a photosensitive FET onto which an optical signal may be directed and a voltage circuit connected to the photosensitive FET for selectively rendering the photosensitive FET responsive or non-responsive to the optical signal. The voltage circuit is connected to the FET to apply one or the other of two predetermined voltages between the source and the drain, such that when one such voltage, which may be zero volts, is applied, the FET produces a negligible electrical signal in response to an optical stimulation and when the other voltage is applied, the FET produces an electrical signal corresponding to the optical stimulation.

In accordance with a further aspect of this invention, the voltage circuit may include a voltage source connected to the photosensitive FET and a semiconductor switch connected across the voltage source to ground to selectively apply the voltage or a ground potential to the FET drain. Alternately the voltage circuit may include a semiconductor switch and a voltage source connected in series with the photosensitive FET, to either apply the voltage to the FET drain or to open circuit to drain.

Many other objects and aspects of the invention will be clear from the detailed description of the drawings.

DETAILED DESCRIPTION

Figure 1:
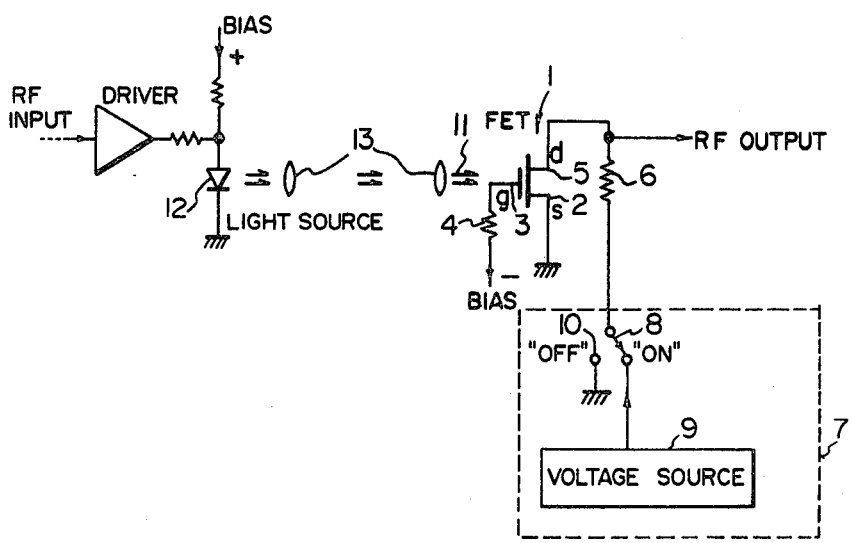
FIG. 1 illustrates the optoelectronic switch in accordance with the present invention.

The optoelectronic switch in accordance with the present invention is shown in FIG. 1 and basically includes a photosensitive FET 1 such as a GaAs FET of the type described in the publication "The OPFET: A new High Speed Optical Detector" by J. C. Gammel et al; International Electron Devices Meeting: IEEE; Washington D.C. Dec. 4–6, 1978; pages 120 to 123. The source 2 of the FET 1 is grounded, the gate 3 is connected through a resistor 4 to a negative bias and the drain 5 is connected through a load resistor 6 to a voltage circuit 7 which provides a positive voltage to the drain 5 when it is desired to have the FET 1 respond to an optical signal. To this end, the voltage circuit 7 may have a switch 8 which will selectively connect the drain 5 to a voltage source 9 or to a ground terminal 10, or again the drain 5 may be left open-circuited. When the drain 5 is connected to the positive voltage source 9, the FET 1 is conductive, when it is connected to ground 10 or left open-circuited, the FET 1 is non-conductive.

This optoelectronic switch will demodulate an optical signal 11 coupled to the FET 1. The modulated optical signal 11 may be obtained by driving an RF input signal through a light source 12 such as a light emitting diode. The modulated optical signal 11 is directed to the FET 1 by a lens system 13 or by other suitable means such as an optical fibre waveguide. The optoelectronic switch is "on" when the potential differences between source 2 and drain 5 is high. The RF signal is recovered by photodetecting the output signal, it is also amplified and may be detected as an RF signal output from across the load resistor 6. When the potential difference between source 2 and drain 5 is low, the optoelectronic switch is "off" at least in part because the FET 1 impedance is altered by the bias and the photodetection efficiency therefore is reduced.

Figure 2:
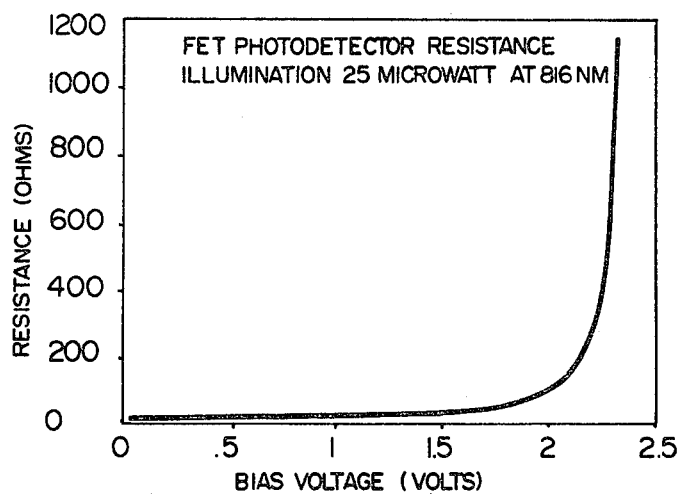
FIG. 2 is a plot of the resistance of a typical FET.

The impedance of FET 1 depends on the voltage applied between the source 2 and drain 5. Because the current through the FET reaches a saturation value as this voltage is increased, the impedance of the FET 1 becomes larger near the saturation voltage by comparison with its impedance for lower bias voltages, as can be seen in FIG. 2 which is a plot of the resistance of a typical FET device as a function of source-drain bias voltage. When the impedance is near the saturation value any photogenerated charge in the FET can be more efficiently transferred into an external circuit connected across the load resistor 6 than when the impedance is small. The change in FET impedance with bias accounts for at least some of the switching action.

Figure 3:
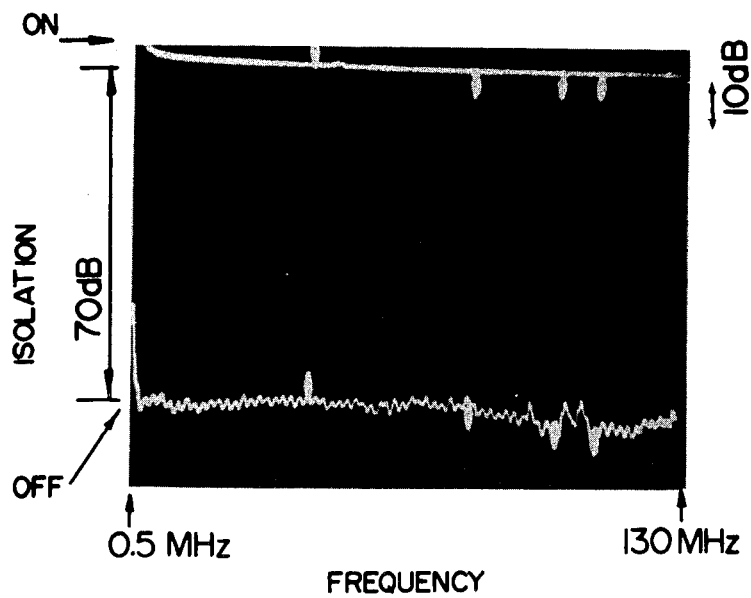
FIGS. 3 or 4 illustrate the isolation obtained by the optoelectronic switch.
Figure 4:
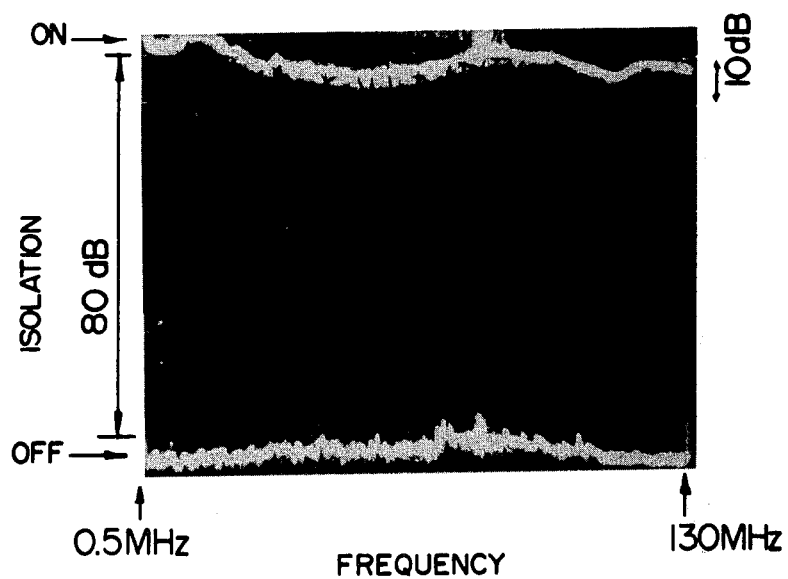

As illustrated in FIG. 3, the optoelectronic switch described in FIG. 1 provides an isolation of over 60 dB over a frequency range of 10 MHz to 130 MHz when the drain 5 is grounded. If the drain 5 is left open circuited, an isolation of over 70 dB is obtained over a frequency range of 10 MHz to 130 MHz as shown in FIG. 4

Figure 5:
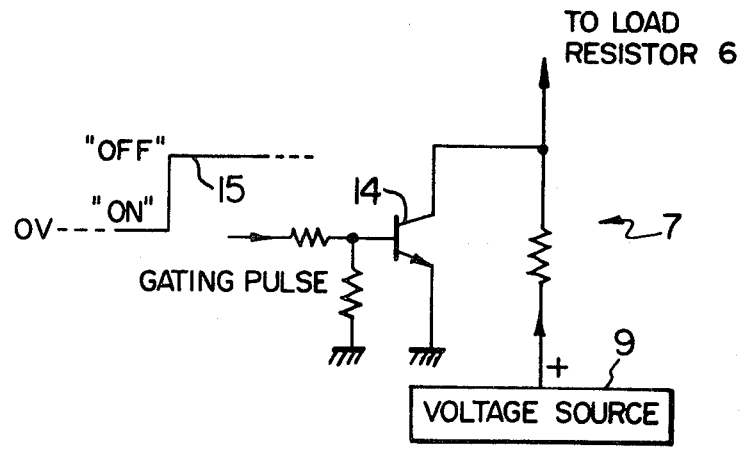
FIGS. 5 and 6 illustrate voltage circuits for the optoelectronic switch.
Figure 6:
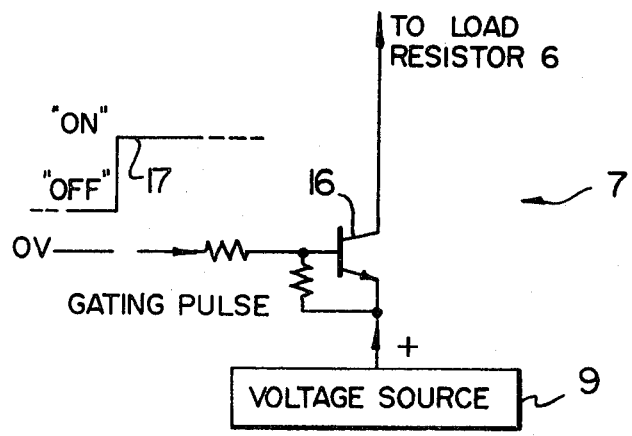

FIGS. 5 and 6 illustrate various switching circuits 7 for switching the bias voltage to the drain 6 of FET 1. In FIG. 5, a transistor 14 is connected across the voltage source 9 to ground 10, such that when transistor 14 is non-conducting, the voltage from source 9 is applied to the FET 1 and the optoelectronic switch is "on". The optoelectronic switch is turned "off" by applying a positive pulse 15 to the transistor 14, rendering it conductive and grounding the FET drain 5.

In FIG. 6, a transistor 16 is connected between the drain 5 and the voltage source 9. The transistor 16 when non-conducting maintains the drain 5 at an open circuit. When a pulse 17 is applied to transistor 16, it conducts and connects the drain 5 to the source 9, switching "on" the optoelectronic switch.

Many modifications in the above described embodiments of the invention can be carried out without departing from the scope thereof and therefore the scope of the present invention is intended to be limited only by the appended claims.

We claim:
1. An optoelectronic switch comprising:
   a photosensitive FET;
   means for directing a modulated optical signal onto the photosensitive FET; and
   voltage means connected to bias the photosensitive FET to selectively render the photosensitive FET responsive or nonresponsive to the optical signal.
2. An optoelectronic switch as claimed in claim 1 wherein the FET includes a source and a drain and the voltage means applies a bias voltage at one of two predetermined levels between the source and the drain, the lower voltage level rendering the FET non-responsive to the optical signal and the higher voltage level rendering the FET responsive to the optical signal.
3. An optoelectronic switch as claimed in claim 1 or 2 wherein the FET is a GaAS FET.
4. An optoelectronic switch as claimed in claims 1 or 2 wherein the voltage means includes a voltage source connected to the photosensitive FET and a semi-conductor switch connected across the voltage source to ground.
5. An optoelectronic switch as claimed in claims 1 or 2 wherein the voltage means includes a semiconductor switch and a voltage source connected in series with the photosensitive FET.

* * * * *